United States Patent [19]

Konishi et al.

[11] Patent Number: 5,135,574

[45] Date of Patent: Aug. 4, 1992

[54] ELECTROLESS PB-SN ALLOY PLATING BATH COMPOSITION

[75] Inventors: Haruo Konishi, Tokyo; Kazuhiro Fukuoka, Matsudo; Keiki Kiyohara, Ibaraki; Saburo Yonekura, Souka; Isao Miyatake, Tokyo, all of Japan

[73] Assignee: Kosaku & Co., Ltd., Tokyo, Japan

[21] Appl. No.: 693,576

[22] Filed: Apr. 30, 1991

[30] Foreign Application Priority Data

Oct. 22, 1990 [JP] Japan ................. 2-281889

[51] Int. Cl.$^5$ ............................ C23C 18/31
[52] U.S. Cl. .................... 106/1.22; 106/1.25
[58] Field of Search ............ 106/1.22, 1.25; 204/44.4

[56] References Cited

U.S. PATENT DOCUMENTS

| | | | |
|---|---|---|---|
| 4,194,913 | 3/1980 | Davis | 106/1.22 |
| 4,459,185 | 7/1984 | Obata et al. | 204/44.4 |
| 4,565,610 | 1/1986 | Nobel et al. | 204/44.4 |
| 4,582,576 | 4/1986 | Opaskar et al. | 106/1.25 |
| 4,662,999 | 5/1987 | Opaskar et al. | 204/44.4 |
| 4,828,657 | 5/1989 | Fukuoka et al. | 204/44.4 |
| 4,871,429 | 10/1989 | Nobel et al. | 204/44.4 |

FOREIGN PATENT DOCUMENTS 4001876 7/1990 Fed. Rep. of Germany.

OTHER PUBLICATIONS

Patent Abstracts of Japan, vol. 13, No. 472 (C-647) (3820) 25 Oct. 1989, & JP-A-1 184 279 (Shinko Electric Ind. Co. Ltd.) 21 Jul. 1989.

*Primary Examiner*—William R. Dixon, Jr.
*Assistant Examiner*—Helene Klemanski
*Attorney, Agent, or Firm*—Oblon, Spivak, McClelland, Maier & Neustadt

[57] ABSTRACT

An electroless Pb-Sn alloy plating bath composition is obtained by mixing at least one of methane sulfonic acid, 1-hydroxyethane-1, 1-diphosphoric acid and a salt of 1-hydroxyethane-1, 1-diposphoric acid, compounds for forming Pb-Sn alloy and a reducing agent.

1 Claim, No Drawings

ELECTROLESS PB-SN ALLOY PLATING BATH COMPOSITION

BACKGROUND OF THE INVENTION

Field of the Invention

This invention relates to an electroless Pb-Sn alloy plating bath composition.

Solder plating is used with electronic components, printed circuit boards and the like for corrosion prevention and component attachment.

The steady increase in the integration density of such electronic components and printed circuits has been accompanied by a tendency toward discrete conductor portions and finer circuit line features. As methods for conducting solder plating there are known the electrolytic solder plating method and the molten solder plating method. Both have drawbacks. Specifically, depending on the shape of the component etc. to be plated, the former method is not able to produce a uniform plating. Moreover, since it is not possible to secure electrical contact at portions that are not in electrical continuity, plating of these portions is impossible. On the other hand, the latter method is incapable of controlling, or ensuring the uniformity of, the plating thickness and is thus likely to result in the formation of electrical shorts, particularly in the case of fine patterns. It also entails heat-related problems such as heat-induced deformation of the substrate of the article being plated.

Prior Art Statement

As a result of research conducted for overcoming these shortcomings of the conventional methods, a number of electroless plating methods have been announced. The first plating bath compositions developed for these methods typically consisted of a mixture of stannous chloride, lead chloride, thiourea and hydrochloric acid, having a reducing agent etc. blended therewith. In a bath of such composition, reaction between the sparingly soluble metal chlorides and the thiourea produces addition compound precipitates. For ensuring that the precipitates dissolve completely so that the liquid remains transparent, the bath has to be maintained at a temperature of at least 70° C. Even then, the aforesaid addition compounds tend to precipitate and separate from the liquid when the article to be plated is immersed therein and causes the temperature of the liquid surrounding it to decrease. Moreover, when electroless plating is conducted at the ordinary temperature using a bath of the foregoing temperature, the plating rate is on the order of only 1 micron per 10 minutes.

While the plating rate can be increased by raising the temperature of the bath composition, when this is done the surface of the plating film tends to become uneven and to be degraded by the deposition of coarse crystal grains. What is more, the plating film obtained reaches a thickness of no more than 3 microns.

For overcoming the defects of the aforementioned chloride bath, it has been proposed to use a borofluoride bath such as the bath comprising tin borofluoride, lead borofluoride, thiourea, borofluoric acid and a reducing agent disclosed in Japanese Patent Publication No. 62(1987)-2630 or, as disclosed in Japanese Patent Publication No. 62(1987)-17202, to use a bath comprising tin borofluoride, lead borofluoride, thiourea and a reducing agent whose concentration is varied between at least two levels during the electroless plating process. Being composed of borofluorides, the baths used in these methods are themselves toxic and pose a danger to those who work with them. They also require special treatment of the waste liquid and involve other problems regarding practical application.

In either the method using a chloride bath or that using borofluorides, the thickness of the film obtained when plating is conducted at 80° C. for 15 minutes is on the order of only about 3 microns. The percentage of tin in the Pb-Sn alloy film obtained is too low to meet any of the S . A and B standards prescribed by JIS-Z3282. Nor does the film do well in fusing tests.

The inventors therefore conducted research for developing a plating bath composition that is free of the aforesaid defects of the prior art, specifically for developing a bath composition that does not require any special waste liquid treatment and which is capable of forming an electroless solder plating film on a copper surface with ease. As a result, they accomplished this invention.

SUMMARY OF THE INVENTION

This invention provides an electroless plating bath composition obtained from a liquid which contains as its essential main components at least one member selected from among the group consisting of methane sulfonic acid, ester of 1-hydroxyethane-1, 1-diphosphoric acid and salts, ester of of 1-hydroxyethane-1, 1-diphosphoric acid, a tin compound for solder plating film formation, a lead compound for solder plating film formation, and a reducing agent.

In addition to the aforesaid main components, the liquid is required to contain thiourea and a surface active agent.

DETAILED DESCRIPTION OF THE PREFERRED EMBODIMENTS

As the tin compound, it is preferable to use, for example, tin (II) oxide. The lead compound is preferably lead oxide or lead acetate.

Differently from the case where a chloride is used, the use of tin oxide results in virtually no generation of low-solubility products. As a result, no precipitation is caused by the temperature drop occurring when the article to be plated is immersed in the bath, the likelihood of an inferior plating being formed is eliminated and the metal concentration of the liquid can easily be maintained at a high level. The area of the plating film formed per unit area of the plating bath is therefore increased and the life and film forming rate of the bath are greatly improved.

The concentration of the tin compound is preferably 18 g/l-36 g/l as tin, while the concentration of the lead compound is preferably 15 g/l-35 g/l as lead.

For preparing the bath composition of this invention there is required at least one member selected from among methane sulfonic acid, ester of 1-hydroxyethane-1, 1-diphosphoric acid and salts of ester of 1-hydroxyethane-1, 1-diphosphoric acid (hereinafter referred to as HEPA and/or salts thereof). The methane sulfonic acid content is preferably 130 g/l-240 g/l and the content of HEPA and/or salts thereof is preferably 4 g/l-20 g/l.

When the methane sulfonic acid content is too low, the bath becomes milky and hydrolysis occurs. When it is too high, the once formed alloy film dissolves again, which slows the rate of film formation and increases the percentage of the film accounted for by tin.

When the tin oxide concentration is lower than that mentioned above, the tin content of the alloy becomes low, the plated surface becomes coarse, and the effect of preventing corrosion of the copper substrate, which is one of the aims in providing the solder alloy plating, cannot be realized. On the other hand, when the concentration is too high, the tin content of the coating film becomes excessive.

The lead salt is preferably lead oxide or lead acetate and, as mentioned earlier, is preferably contained at 15 g/l-35 g/l as lead. When its concentration is too low, the tin content of the alloy film becomes large. On the other hand, when its concentration is too high, the lead content of the alloy film becomes large, which is undesirable because it causes the coating film surface to become coarse, reduces the adherence of the film to the substrate and, by raising the melting point of the alloy film, markedly degrades its solder attachment property thus making it impossible for the film to achieve one of its main purposes.

The thiourea concentration is preferably 70 g/l-140 g/l. When its concentration is too low, the plating rate becomes low and when too high, the tin content of the alloy film becomes high and the plating rate decreases sharply.

As stated above, the concentration of HEPA and/or salts thereof is 4 g/l-20 g/l. At a concentration within this range, the surface of the deposited film is fine grained and exhibits a dull luster. In short, the results are excellent. Lower concentrations do not contribute to obtaining a fine-grained texture nor to realizing a finish with a dull luster. Above this range, deposition of tin is does not increase in proportion to the increased amount of tin present, with the result that the tin content of the alloy film decreases.

When HEPA and/or salts thereof and methane sulfonic acid are both present in the plating composition, the concentration of the methane sulfonic acid is preferably 125 g/l-225 g/l.

The concentration of the reducing agent is preferably 44 g/l-150 g/l. At lower concentrations, a large amount of metal remains in the bath after completion of the reduction reaction, while at high concentrations, gas is generated as the temperature increases and causes pits to form in the deposited film.

An anionic surface active agent is used. For example, it is possible to use lignosulfonic acid at a concentration of 0.1 g/l-0.2 g/l or polyacrylic acid at a concentration of 5 ml/l-8 ml/l. The amount of either of these added is determined in light of the concentration of the composition.

In the solder plating composition according to the invention, the tin and lead are present as salts of methane sulfonic acid and HEPA, The effect of the invention will now be explained with respect to examples of the invention and comparative examples. The substrates for plating and the processing steps used in the examples and comparative examples were as follows:

---

1) Substrates for plating
a) 50 × 50 × 0.4 mm copper sheet
b) 60 mm × 10 mm φ copper tube
c) Double-sided printed circuit having a discrete copper circuit constituted of 50 [500 mm (L) × 0.1 mm (W)] lines with a line spacing of 0.05 mm
2) Processing steps
Each of the substrates of 1) were treated as follows:
a) Pretreatment
Acid degreasing (40° C.) ——> water rinsing ——> soft etching ——> water rinsing ——> acid soaking ——> water rinsing
b) Posttreatment
Cold water rinsing ——> hot water rinsing ——> drying in hot air stream
3) The resulting substrates were subjected to electroless plating in the baths indicated as examples of the invention in Tables 1(a) and (b) or in the baths indicated as comparative examples in Tables 2 and 3, under the conditions shown in the respective tables.

---

The plating film obtained in each of the examples and comparative examples was then subjected to the following tests.

---

4) Plating film test
a) Measurement of film thickness and alloying ratio by the fluorescent x-ray method
b) Measurement of state of fusing following holding at 190° C.-195° C. for 40 sec in an infrared furnace.
G (Good) = total fusing F (Fair) = 40-60 % fusing NG (No Good) = total lack of fusing
c) Testing for short-circuiting of printed circuit board.
G = No shorting NG = Shorting
d) Bending test (copper sheet and copper tube) Observation of abnormalities after bending at 180° C.
G = No abnormalities NG = Abnormalities found
e) Visual observation of plating film surface
G = Luster F = Rough NG = Very uneven
f) Plating film-to-substrate adhesion test (by adhesive tape)
G = Pass

---

The results of the plating film tests with respect to the examples and comparative examples are shown in the tables. Table 1 relates to examples according to the invention. Table 2 relates to comparative examples using baths containing the same materials as the baths in the examples but in amounts outside the range of the invention. FIG. 3 relates to comparative examples using conventional electroless plating baths.

TABLE 1a

| | Example No. | 1 | 2 | 3 | 4 | 5 | 6 | 7 | 8 | 9 | 10 |
|---|---|---|---|---|---|---|---|---|---|---|---|
| Bath composition | Methane sulfonic acid g/l | 130 | 130 | 130 | 150 | 150 | 150 | 170 | 170 | 170 | 200 |
| | HEPA g/l | | | | | | | | | | |
| | HEPA Na salt g/l | | | | | | | | | | |
| | HEPA K salt g/l | | | | | | | | | | |
| | Sn (II) oxide (as Sn) g/l | 18 | 18 | 18 | 25 | 25 | 25 | 28 | 28 | 28 | 32 |
| | Sn (III) chloride (as Sn) g/l | | | | | | | | | | |
| | Lead oxide (as Pb) g/l | 15 | 15 | 15 | | | | 23 | 23 | 23 | |
| | Lead acetate (as Pb) g/l | | | | 21 | 21 | 21 | | | | 27 |
| | Hydrochloric acid 35% ml/l | | | | | | | | | | |
| | Lead chloride (as Pb) g/l | | | | | | | | | | |

TABLE 1a-continued

| | | 1 | 2 | 3 | 4 | 5 | 6 | 7 | 8 | 9 | 10 |
|---|---|---|---|---|---|---|---|---|---|---|---|
| | Thiourea g/l | 70 | 70 | 70 | 100 | 100 | 100 | 120 | 120 | 120 | 130 |
| | Hypophosphorous acid Na salt g/l | 44 | 44 | 44 | 60 | 60 | 60 | 80 | 80 | 80 | 75 |
| | Dodecylsulfuric acid Na salt g/l | | | | | | | | | | |
| | Polyacrylic acid ml/l | 5 | 5 | 5 | | | | | | | |
| | Polyacrylic acid Na salt ml/l | | | | 6 | 6 | 6 | | | | 7 |
| | Ligunosulfonic acid g/l | | | | | | | 0.1 | 0.1 | 0.1 | |
| | Ligunosulfonic acid Na salt g/l | | | | | | | | | | |
| Plating conditions | pH | 0.8 | 0.8 | 0.8 | 0.7 | 0.7 | 0.7 | 0.7 | 0.7 | 0.7 | 0.8 |
| | Temp. (°C.) | 70 | 70 | 70 | 70 | 70 | 70 | 70 | 70 | 70 | 70 |
| | Plating time (min) | 5 | 15 | 30 | 5 | 15 | 30 | 5 | 15 | 30 | 5 |
| Film test results | Plating film Thickness (μm) | 3.2 | 7.0 | 13.5 | 3.4 | 7.2 | 14.0 | 3.0 | 6.9 | 12.8 | 2.9 |
| | Sn ratio (wt %) | 63.6 | 64.5 | 65.1 | 62.2 | 62.8 | 63.5 | 61.5 | 61.9 | 62.6 | 62.4 |
| | Fusing test | G | G | G | G | G | G | G | G | G | G |
| | Shorting test | G | G | G | G | G | G | G | G | G | G |
| | Bending test | G | G | G | G | G | G | G | G | G | G |
| | Surface state | G | G | G | G | G | G | G | G | G | G |
| | Adhesion test | G | G | G | G | G | G | G | G | G | G |

| | Example No. | 11 | 12 | 13 | 14 | 15 | 16 | 17 | 18 | 19 | 20 |
|---|---|---|---|---|---|---|---|---|---|---|---|
| Bath composition | Methane sulfonic acid g/l | 200 | 200 | 220 | 220 | 220 | 240 | 240 | 240 | 200 | 200 |
| | HEPA g/l | | | | | | 4 | 4 | 4 | | |
| | HEPA Na salt g/l | | | | | | | | | | |
| | HEPA K salt g/l | | | | | | | | | | |
| | Sn (II) oxide (as Sn) g/l | 32 | 32 | 30 | 30 | 30 | 36 | 36 | 36 | 30 | 30 |
| | Sn (III) chloride (as Sn) g/l | | | | | | | | | | |
| | Lead oxide (as Pb) g/l | | | 25 | 25 | 25 | 35 | 35 | 35 | 25 | 25 |
| | Lead acetate (as Pb) g/l | 27 | 27 | | | | | | | | |
| | Hydrochloric acid 35% ml/l | | | | | | | | | | |
| | Lead chloride (as Pb) g/l | | | | | | | | | | |
| | Thiourea g/l | 130 | 130 | 125 | 125 | 125 | 140 | 140 | 140 | 130 | 130 |
| | Hypophosphorous acid Na salt g/l | 75 | 75 | 110 | 110 | 110 | 150 | 150 | 150 | 100 | 100 |
| | Dodecylsulfuric acid Na salt g/l | | | | | | | | | | |
| | Polyacrylic acid ml/l | | | | | | 8 | 8 | 8 | 6 | 6 |
| | Polyacrylic acid Na salt ml/l | 7 | 7 | | | | | | | | |
| | Ligunosulfonic acid g/l | | | | | | | | | | |
| | Ligunosulfonic acid Na salt g/l | | | 0.2 | 0.2 | 0.2 | | | | | |
| Plating conditions | pH | 0.8 | 0.8 | 0.8 | 0.8 | 0.8 | 0.7 | 0.7 | 0.7 | 0.7 | 0.7 |
| | Temp. (°C.) | 70 | 70 | 75 | 75 | 75 | 75 | 75 | 75 | 70 | 70 |
| | Plating time (min) | 15 | 30 | 5 | 15 | 30 | 5 | 15 | 30 | 5 | 15 |
| Film test results | Plating film Thickness (μm) | 6.5 | 13.0 | 3.1 | 5.9 | 13.1 | 2.8 | 6.2 | 14.1 | 3.6 | 7.0 |
| | Sn ratio (wt %) | 63.0 | 63.8 | 64.1 | 64.8 | 65.2 | 62.7 | 63.2 | 64.0 | 66.5 | 67.0 |
| | Fusing test | G | G | G | G | G | G | G | G | G | G |
| | Shorting test | G | G | G | G | G | G | G | G | G | G |
| | Bending test | G | G | G | G | G | G | G | G | G | G |
| | Surface state | G | G | G | G | G | G | G | G | G | G |
| | Adhesion test | G | G | G | G | G | G | G | G | G | G |

| | Example No. | 21 | 22 | 23 | 24 | 25 | 26 | 27 | 28 | 29 | 30 |
|---|---|---|---|---|---|---|---|---|---|---|---|
| Bath composition | Methane sulfonic acid g/l | 200 | 125 | 125 | 125 | 155 | 155 | 155 | 220 | 220 | 220 |
| | HEPA g/l | | 20 | 20 | 20 | 15 | 15 | 15 | 10 | 10 | 10 |
| | HEPA Na salt g/l | | | | | | | | | | |
| | HEPA K salt g/l | | | | | | | | | | |
| | Sn (II) oxide (as Sn) g/l | 30 | 18 | 18 | 18 | 20 | 20 | 20 | 30 | 30 | 30 |
| | Sn (III) chloride (as Sn) g/l | | | | | | | | | | |
| | Lead oxide (as Pb) g/l | 25 | 16 | 16 | 16 | | | | 25 | 25 | 25 |
| | Lead acetate (as Pb) g/l | | | | | 13 | 13 | 13 | | | |
| | Hydrochloric acid 35% ml/l | | | | | | | | | | |
| | Lead chloride (as Pb) g/l | | | | | | | | | | |
| | Thiourea g/l | 130 | 70 | 70 | 70 | 100 | 100 | 100 | 120 | 120 | 120 |
| | Hypophosphorous acid Na salt g/l | 100 | 45 | 45 | 45 | 75 | 75 | 75 | 100 | 100 | 100 |
| | Dodecylsulfuric acid Na salt g/l | | | | | | | | | | |
| | Polyacrylic acid ml/l | 6 | 5 | 5 | 5 | | | | 6 | 6 | 6 |
| | Polyacrylic acid Na salt ml/l | | | | | 7 | 7 | 7 | | | |
| | Ligunosulfonic acid g/l | | | | | | | | | | |
| | Ligunosulfonic acid Na salt g/l | | | | | | | | | | |
| Plating conditions | pH | 0.7 | 1.0 | 1.0 | 1.0 | 1.0 | 1.0 | 1.0 | 0.9 | 0.9 | 0.9 |
| | Temp. (°C.) | 70 | 75 | 75 | 75 | 70 | 70 | 70 | 70 | 70 | 70 |
| | Plating time (min) | 30 | 5 | 15 | 30 | 5 | 15 | 30 | 5 | 15 | 30 |
| Film test results | Plating film Thickness (μm) | 13.5 | 3.2 | 5.8 | 13.6 | 3.4 | 5.8 | 12.9 | 3.3 | 6.1 | 14.4 |
| | Sn ratio (wt %) | 67.4 | 61.9 | 62.5 | 63.2 | 61.6 | 62.4 | 63.7 | 60.6 | 61.2 | 63.4 |
| | Fusing test | G | G | G | G | G | G | G | G | G | G |
| | Shorting test | G | G | G | G | G | G | G | G | G | G |
| | Bending test | G | G | G | G | G | G | G | G | G | G |
| | Surface state | G | G | G | G | G | G | G | G | G | G |
| | Adhesion test | G | G | G | G | G | G | G | G | G | G |

TABLE 2

| | C. Example No. | 1 | 2 | 3 | 4 | 5 | 6 | 7 | 8 | 9 | 10 | 11 | 12 |
|---|---|---|---|---|---|---|---|---|---|---|---|---|---|
| Bath composition | Methane sulfonic acid g/l | 80 | 80 | 80 | 270 | 270 | 270 | 240 | 240 | 240 | 200 | 200 | 200 |
| | HEPA g/l | | | | | | | | | | | | |

TABLE 2-continued

|  |  | | | | | | | | | | | | |
|---|---|---|---|---|---|---|---|---|---|---|---|---|---|
| | HEPA Na salt g/l | | | | | | | | | | | | |
| | HEPA K salt g/l | | | | | | | | | | | | |
| | Sn (II) oxide (as Sn) g/l | 18 | 18 | 18 | 36 | 36 | 36 | 45 | 45 | 45 | 32 | 32 | 32 |
| | Sn (III) chloride (as Sn) g/l | | | | | | | | | | | | |
| | Lead oxide (as Pb) g/l | 15 | 15 | 15 | 35 | 35 | 35 | 35 | 35 | 35 | | | |
| | Lead acetate (as Pb) g/l | | | | | | | | | | 35 | 35 | 35 |
| | Hydrochloric acid 35% ml/l | | | | | | | | | | | | |
| | Lead chloride (as Pb) g/l | | | | | | | | | | | | |
| | Thiourea g/l | 70 | 70 | 70 | 140 | 140 | 140 | 140 | 140 | 140 | 140 | 140 | 140 |
| | Hypophosphorous acid Na salt g/l | 44 | 44 | 44 | 150 | 150 | 150 | 150 | 150 | 150 | 150 | 150 | 150 |
| | Dodecylsulfuric acid Na salt g/l | | | | | | | | | | | | |
| | Polyacrylic acid ml/l | 5 | 5 | 5 | 8 | 8 | 8 | 8 | 8 | 8 | 8 | 8 | 8 |
| | Polyacrylic acid Na salt ml/l | | | | | 7 | 7 | | | | | | |
| | Ligunosulfonic acid g/l | | | | | | | | | | | | |
| | Ligunosulfonic acid Na salt g/l | | | | | | | | | | | | |
| Conditions | pH | 0.8 | 0.8 | 0.8 | 0.7 | 0.7 | 0.7 | 0.7 | 0.7 | 0.7 | 0.7 | 0.7 | 0.7 |
| | Temp. (°C.) | 70 | 70 | 70 | 75 | 75 | 75 | 70 | 70 | 70 | 75 | 75 | 75 |
| | Plating time (min) | 5 | 15 | 30 | 5 | 15 | 30 | 5 | 15 | 30 | 5 | 15 | 30 |
| Film test results | Film Thickness (μm) | 1.3 | 2.0 | 2.4 | 1.8 | 2.2 | 6.5 | 2.2 | 3.6 | 7.1 | 3.2 | 6.8 | 15.5 |
| | Sn ratio (wt %) | Hydrolysis | | | 74.6 | 75.0 | 77.2 | 84.6 | 86.2 | 88.5 | 42.2 | 49.5 | 50.1 |
| | Fusing test | Testing impossible | | | F | F | F | F | F | F | NG | NG | NG |
| | Shorting test | | | | G | G | G | G | G | G | — | — | — |
| | Bending test | | | | G | G | G | G | G | G | NG | NG | NG |
| | Surface state | | | | NG | NG | NG | NG | NG | NG | NG | NG | NG |

| | C. Example No. | 13 | 14 | 15 | 16 | 17 | 18 | 19 | 20 | 21 | 22 | 23 | 24 |
|---|---|---|---|---|---|---|---|---|---|---|---|---|---|
| Bath composition | Methane sulfonic acid g/l | | | | | | | | | | | | |
| | HEPA g/l | 20 | 20 | 20 | | | | | | | | | |
| | HEPA Na salt g/l | | | | 15 | 15 | 15 | | | | | | |
| | HEPA K salt g/l | | | | | | | | | | | | |
| | Sn (II) oxide (as Sn) g/l | | | | | | | | | | | | |
| | Sn (III) chloride (as Sn) g/l | 48 | 48 | 48 | 48 | 48 | 48 | 10 | 10 | 10 | 10 | 10 | 10 |
| | Lead oxide (as Pb) g/l | | | | | | | | | | | | |
| | Lead acetate (as Pb) g/l | 20 | 20 | 20 | 20 | 20 | 20 | | | | | | |
| | Hydrochloric acid 35% ml/l | 86 | 86 | 86 | 90 | 90 | 90 | | | | | | |
| | Lead chloride (as Pb) g/l | | | | | | | 6 | 6 | 6 | 6 | 6 | |
| | Thiourea g/l | 100 | 100 | 100 | 100 | 100 | 100 | 120 | 120 | 120 | 120 | 120 | 120 |
| | Hypophosphorous acid Na salt g/l | 110 | 110 | 110 | 110 | 110 | 110 | 30 | 30 | 30 | 30 | 30 | 30 |
| | Dodecylsulfuric acid Na salt g/l | 0.5 | 0.5 | 0.5 | 0.5 | 0.5 | 0.5 | 0.2 | 0.2 | 0.2 | 0.2 | 0.2 | 0.2 |
| | Polyacrylic acid ml/l | | | | | | | | | | | | |
| | Polyacrylic acid Na salt ml/l | | | | | | | | | | | | |
| | Ligunosulfonic acid g/l | | | | | | | | | | | | |
| | Ligunosulfonic acid Na salt g/l | | | | | | | | | | | | |
| Conditions | pH | 0.7 | 0.7 | 0.7 | 0.7 | 0.7 | 0.7 | 1.2 | 1.2 | 1.2 | 1.2 | 1.2 | 1.2 |
| | Temp. (°C.) | 80 | 80 | 80 | 85 | 85 | 85 | 90 | 90 | 75 | 75 | 70 | 70 |
| | Plating time (min) | 5 | 15 | 30 | 5 | 15 | 30 | 5 | 15 | 5 | 15 | 5 | 15 |
| Film test results | Film Thickness (μm) | 3.8 | 7.0 | 13.5 | 3.0 | 6.2 | 13.3 | 0.9 | 1.2 | 0.5 | 0.7 | Precipitation Plating not possible | |
| | Sn ratio (wt %) | 67.6 | 69.4 | 70.9 | 66.6 | 67.8 | 69.2 | 80.2 | 82.5 | 81.9 | 83.3 | | |
| | Fusing test | G | G | F | G | G | G | F | F | F | F | | |
| | Shorting test | G | G | G | G | G | G | G | G | G | G | | |
| | Bending test | G | G | G | G | G | G | G | G | G | G | | |
| | Surface state | NG | NG | NG | NG | NG | NG | | | | | | |

TABLE 3

| | Comparative Example No. | | 25 | 26 | 27 | 28 |
|---|---|---|---|---|---|---|
| Composition | Borofluoric acid | ml/l | 45 | 45 | 90 | 90 |
| | Tin (II) borofluoride | g/l | 30 | 30 | 30 | 30 |
| | Lead borofluoride | g/l | 15 | 15 | 10 | 10 |
| | Thiourea | g/l | 130 | 130 | 130 | 130 |
| | Sodium hypophosphate | g/l | 50 | 50 | 50 | 50 |
| | Sodium ethylenediaminetetraacetate | g/l | 15 | 15 | 10 | 10 |
| | Surface active agent | g/l | 0.5 | 0.5 | 0.5 | 0.5 |
| Conditions | pH | | 1.2 | 1.2 | 1.0 | 1.0 |
| | Temperature | °C. | 85 | 85 | 80 | 80 |
| | Plating time | min | 5 | 15 | 5 | 10 |
| Film test results | Film Thickness | μm | 1.9 | 2.8 | 2.3 | 2.7 |
| | Tin ratio | wt % | 76.2 | 77.6 | 82.2 | 83.4 |
| | Fusing test | | F | F | F | F |
| | Shorting test | | G | G | G | G |
| | Bending test | | G | G | G | G |
| | Surface test | | F | NG | F | F |

From the results indicated in Tables 1, 2 and 3 it is clear that the electroless Pb—Sn alloy plating bath composition according to the present invention produces excellent effect in practical applications.

We claim:
1. An electroless plating bath composition comprising a mixture consisting essentially of:
    130 to 240 g/l of methane sulfonic acid;

4 to 20 g/l of at least one member selected from the group consisting of ester of 1-hydroxyethane-1,1-diphosphoric acid and a salt thereof;
18 to 36 g/l as tin of tin (II) oxide for solder plating film formation;
15 to 35 g/l as Pb of a Pb compound selected from the group consisting of lead oxide and lead acetate for solder plating film formation; 70 to 140 g/l of thiourea;
one surface active agent selected from the group consisting of 0.1 to 0.2 g/l of ligunosulfonic acid and 5 to 8 ml/l of polyacrylic acid; and
44 to 150 g/l of a reducing agent.

* * * * *